(12) United States Patent
Müllauer et al.

(10) Patent No.: US 7,342,760 B2
(45) Date of Patent: Mar. 11, 2008

(54) CIRCUIT ARRANGEMENT FOR PROTECTION AGAINST ELECTROSTATIC DISCHARGE AND VOLTAGE REGULATING DEVICE HAVING A CIRCUIT ARRANGEMENT

(75) Inventors: Markus Müllauer, Friesach (AT); Roman Riederer, Villach (AT)

(73) Assignee: Infineon Technologies AG, Munich (DE)

( * ) Notice: Subject to any disclaimer, the term of this patent is extended or adjusted under 35 U.S.C. 154(b) by 509 days.

(21) Appl. No.: 10/931,170

(22) Filed: Aug. 31, 2004

(65) Prior Publication Data

US 2005/0083622 A1 Apr. 21, 2005

(30) Foreign Application Priority Data

Sep. 1, 2003 (DE) ............................... 103 40 603

(51) Int. Cl.
*H02H 3/00* (2006.01)
(52) U.S. Cl. ..................... 361/84; 361/18; 361/56; 361/82; 361/91.1
(58) Field of Classification Search .................. 361/56, 361/111, 118, 91.1, 18, 78–79, 82, 84, 86
See application file for complete search history.

(56) References Cited

U.S. PATENT DOCUMENTS

| | | | | |
|---|---|---|---|---|
| 5,424,892 A | * | 6/1995 | Topp et al. ................. | 361/18 |
| 5,453,900 A | * | 9/1995 | Feldtkeller ................. | 361/18 |
| 5,917,689 A | * | 6/1999 | English et al. ............. | 361/56 |
| 5,959,332 A | | 9/1999 | Ravanelli et al. | |
| 6,552,879 B2 | * | 4/2003 | Voldman .................... | 360/323 |
| 6,678,130 B2 | * | 1/2004 | Ratner et al. .............. | 361/18 |
| 7,068,482 B2 | * | 6/2006 | Chen .......................... | 361/56 |
| 2002/0130366 A1 | | 9/2002 | Morishita | |

FOREIGN PATENT DOCUMENTS

| DE | 196 29 511 C2 | 9/1997 |
|---|---|---|
| WO | WO 01/11685 A1 | 2/2001 |

* cited by examiner

*Primary Examiner*—Robert L. Deberadinis
*Assistant Examiner*—Terrence R. Willoughby
(74) *Attorney, Agent, or Firm*—Eschweiler & Associates LLC

(57) ABSTRACT

A circuit arrangement for protection against electrostatic discharge for a field-effect transistor is disclosed. The arrangement includes a first and a second controllable path each having a control terminal. The control terminals of the controllable paths are coupled to a source terminal of the field-effect transistor. A first terminal of the first controllable path is connected to a control terminal of the transistor, and a first terminal of the second controllable path is connected to a bulk terminal of the unipolar transistor. Second terminals of the controllable paths are connected to the drain terminal. A voltage regulating device includes the circuit arrangement and a comparator configured to generate a control signal in a manner dependent on a difference between two signals applied thereto. A control output of the comparator is coupled to the control terminal of the transistor.

15 Claims, 3 Drawing Sheets

US 7,342,760 B2

CIRCUIT ARRANGEMENT FOR PROTECTION AGAINST ELECTROSTATIC DISCHARGE AND VOLTAGE REGULATING DEVICE HAVING A CIRCUIT ARRANGEMENT

REFERENCE TO RELATED APPLICATION

This application claims the benefit of the priority date of German application DE 103 40 603.4, filed on Sep. 1, 2003, the contents of which are herein incorporated by reference in their entirety.

FIELD OF THE INVENTION

The invention relates to a circuit arrangement. The invention furthermore relates to a voltage regulating device having a circuit arrangement.

BACKGROUND OF THE INVENTION

Battery-operated apparatuses such as mobile telephones, laptops or PDAs often require different supply voltages for their individual circuits. For this purpose, they use voltage regulators that transform the voltage supplied by the battery into the required supply voltage. The output voltage of such a voltage regulator is often close to the battery voltage. For such cases, voltage regulators are usually realized with MOS transistors as output stages, because these have the advantage over bipolar transistors that they can also realize small voltage differences between an input voltage and an output voltage. In addition, compared with bipolar transistors, they operate without any power and require no base currents. In the concrete case of the embodiment, however, problems may arise with MOS transistors if a potential applied to the drain terminal changes unfavorably.

Such a case is shown schematically in FIG. 3. The latter shows a PMOS field-effect transistor having a source terminal 2, a drain terminal 1 and also a gate terminal 3. The PMOS transistor is formed in an n-doped well having a plurality of heavily n-doped regions n+ that form the contacts for a bulk terminal 4. The potential VS is present at the source terminal 2 of the PMOS transistor and the potential VD is present at the drain terminal 1 of the transistor. A connection between the source terminal 2 and the bulk terminal 4 pulls the n-type well of the PMOS transistor to the source potential VS.

If the potential VD exceeds the potential VS by the value of a threshold voltage, then the pn junctions act as forward-biased substrate diodes BD. A parasitic vertical transistor VT and a parasitic lateral transistor LT are formed, which may bring about an undesirable current flow and, in the worst case, destroy a circuit connected to the drain terminal. In order to avoid damage to an integrated circuit as a result of a current flow in the opposite direction, the prior art makes use of the following solutions.

FIG. 4A shows a pnp bipolar transistor as an output stage. Its base-emitter diode inhibits the current path to the supply potential at the input S if the potential at the output D lies above the potential at the input S. However, such a design requires a base current and furthermore exhibits a relatively high saturation voltage.

In FIG. 4B, a Schottky diode SD is connected between the drain terminal of a PMOS transistor and an output D.

Said Schottky diode inhibits a current if it is biased in the opposite direction, that is to say the potential at the output D rises above the input potential at S. A disadvantage of this embodiment is the voltage drop across the Schottky diode, which thus defines a minimum voltage difference between input S and D.

FIG. 4C shows a known concept having a second PMOS transistor ST that operates in the opposite direction and is in a conducting state only in the normal operating mode. This likewise prevents a current in the opposite direction. However, a small difference between the potential at the input S and the potential at the output D is likewise impossible in the case of this circuit. The concept known from FIG. 4C is suitable rather for high-voltage applications in which power transistors are used.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description that is presented later.

The invention comprises a circuit arrangement having a MOS transistor, preferably used in a voltage regulating circuit, that reliably prevents a current flow in the opposite direction through the MOS transistor. Furthermore, a voltage regulating circuit is disclosed that concurrently enables a small voltage difference between the input and output.

Provision is made of a circuit arrangement having a unipolar transistor, in particular having a field-effect transistor of a first conductivity type, the unipolar transistor having a source terminal, a drain terminal, a control terminal for controlling the conductivity of the unipolar transistor, and also a bulk terminal. The circuit arrangement comprises a first and a second controllable path, in each case having a control terminal for controlling the first and the second controllable path. The control terminal of the first and of the second controllable path is coupled to the source terminal of the unipolar transistor. A first terminal of the first controllable path is connected to the control terminal of the unipolar transistor. A first terminal of the second controllable path is connected to the bulk terminal of the unipolar transistor. A second terminal of the first controllable path and a second terminal of the second controllable path are connected to the drain terminal of the unipolar transistor.

According to the invention, this arrangement prevents an undesired current flow in the opposite direction, i.e. from the drain terminal to the source terminal. Said current flow occurs when a potential applied to the source terminal of the unipolar field-effect transistor falls below a potential at the drain terminal of the unipolar transistor. Conversely, a potential at the drain terminal then rises above a potential at the source terminal of the unipolar transistor. In such a case, the control terminal of the first controllable path switches the latter into a conducting state, as a result of which the control terminal of the unipolar component is pulled to the potential present at the drain terminal. At the same time, the second controllable path puts the potential at the bulk terminal of the unipolar transistor at the potential of the drain terminal. This likewise suppresses an undesirable current flow through the substrate material of the unipolar transistor from the drain terminal to the bulk and source terminal.

A voltage regulating device having such a circuit arrangement furthermore comprises a comparator circuit, which is formed for generating a control signal in a manner dependent on a difference between two signals applied on the input side. A control output of the comparator circuit is coupled to the control terminal of the unipolar transistor. An input of the comparator circuit is coupled to the drain terminal of the unipolar transistor. It is particularly expedient to provide an operational amplifier or an error amplifier as comparator circuit.

This device controls the output potential at the drain terminal of the unipolar transistor such that even small voltage differences between a potential at the source terminal and a potential at the drain terminal of the unipolar transistor are possible. At the same time, the circuit arrangement prevents an unintentional current flow in the opposite direction, i.e. from the drain terminal to the source terminal.

In one refinement, at least one of the controllable paths is formed by a bipolar transistor. The emitter terminal of the bipolar transistor forms the second terminal of the controllable path and the collector terminal forms the first terminal of the controllable path. The base of the bipolar transistor, which has a second conductivity type, represents the control terminal of the at least one of the two controllable paths. The majority charge carriers of the base of the at least one bipolar transistor are thus different from the current-carrying charge carriers of the unipolar transistor. Such a refinement is expedient particularly when the at least one bipolar transistor is formed as a parasitic bipolar transistor in metal oxide semiconductor circuit technology. As a result, the entire circuit arrangement including the field-effect transistor to be protected can be realized with the aid of an integrated module. The required bipolar transistors may advantageously also be realized by parasitic elements in a CMOS process. These may be used in a special layout of the circuit.

In a development of the invention, the reference potential terminal of the unipolar transistor is coupled to the source terminal of the unipolar transistor by a resistor. This significantly reduces the current flow through the undesirably forward-biased pn junctions of the unipolar transistor.

In a development of the voltage regulating device, the control output of the comparator circuit is connected to a control input of a third controllable path. In this case, a first terminal of the third controllable path is connected to a reference potential terminal, which preferably carries the ground potential. A second terminal of the third controllable path is connected to a current source and also to the control terminal of the unipolar transistor.

In an expedient embodiment of this development, the current source has two bipolar transistors forming a current mirror, in the case of which a collector output of one of the two bipolar transistors is connected to the second terminal of the third controllable path.

In another development of the voltage regulating device, the source terminal of the unipolar transistor is connected to a first terminal of a fourth controllable path, and the second terminal of the fourth controllable path is connected to the control terminal of the unipolar transistor via a resistor. Said fourth controllable path serves for switching off the voltage regulating device.

BRIEF DESCRIPTION OF THE DRAWINGS

The invention is explained in detail below on the basis of an exemplary embodiment with the aid of the drawings, in which.

DETAILED DESCRIPTION OF THE INVENTION

Figure 1A:
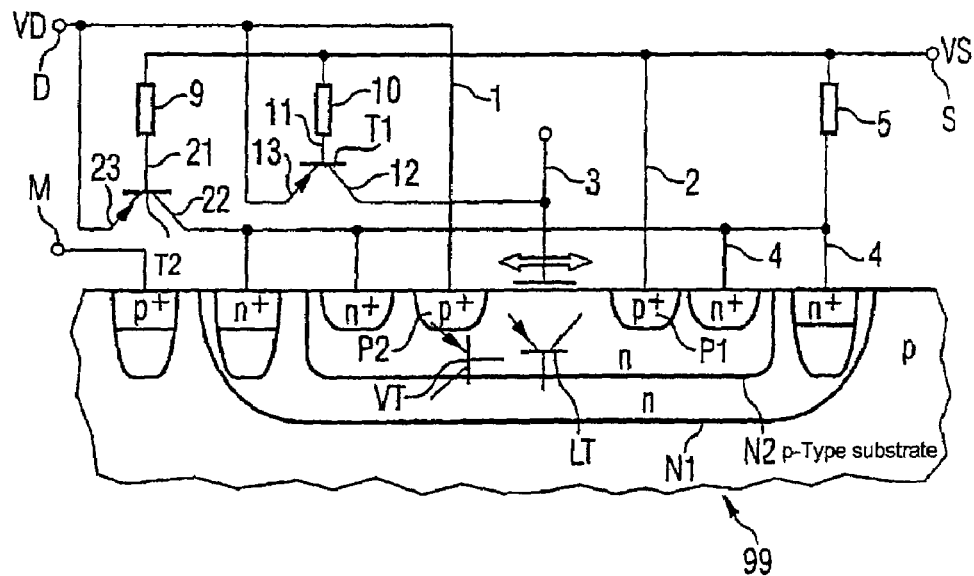
FIG. 1a shows an exemplary embodiment of a circuit arrangement having a MOS transistor.

FIG. 1a shows a circuit arrangement having a PMOS field-effect transistor in which an undesirable current flow is prevented.

The PMOS transistor 99 is formed in a doped semiconductor substrate. The semiconductor substrate is p-doped and contains a heavily p-doped region p+ for a connection to ground. Within the substrate, an n-doped region is formed as a well which, for its part, is subdivided into two n-doped partial regions N1 and N2 having different doping concentrations. The region N2 is an n-doped partial well in which two heavily p-doped regions P1 and P2 are embedded. The region P1 is called the source of the PMOS transistor 99 and furthermore has a source terminal 2. The region P2 represents the drain and contains the drain terminal 1. Between the source region P1 and drain region P2, a charge carrier channel can form through application of a potential to the control input 3 and the control electrode (not shown here) or a channel that has formed can be altered. P-type charge carriers flow through the channel. These charge carriers determine the conductivity type of the MOS transistor, that is to say positive charge carriers or holes in the case of the embodiment. By means of a control signal at the control terminal 3, it is possible to determine the conductivity of the channel of the PMOS transistor 99 and thus the voltage drop across the channel.

Furthermore, the n-doped regions N1 and N2 contain a plurality of heavily doped terminal contacts that are interconnected and form the bulk terminal 4. The bulk terminals are therefore connected to the channel region.

The drain terminal 1 of the PMOS transistor is connected to the output D of the circuit arrangement according to the invention and is additionally connected to the emitter terminal 13 of a first pnp bipolar transistor T1 and to the emitter terminal 23 of a second pnp bipolar transistor T2. The collector terminal 12 of the first bipolar transistor T1 is connected to the control terminal 3 of the PMOS transistor. The collector terminal 22 of the second bipolar transistor T2 leads to the bulk terminal 4 of the field-effect transistor.

Figure 1B:
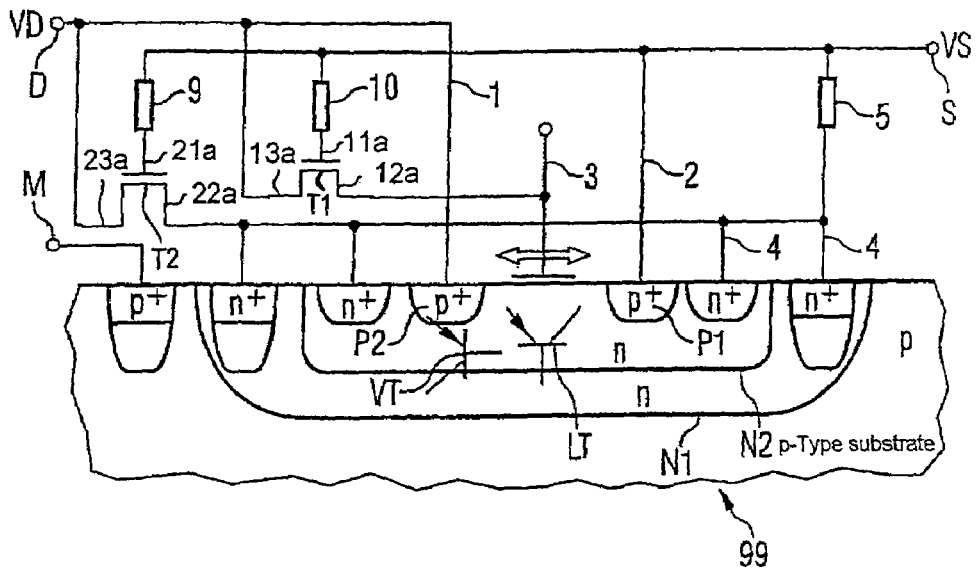
FIG. 1b shows an exemplary embodiment of a circuit arrangement having a MOS transistor and unipolar transistor paths.

Furthermore, the collector terminal 22 of the second bipolar transistor T2 and also the bulk terminal 4 are connected via a resistor 5 on the one hand to a terminal S, that is to say to the source terminal 2. The base terminals 21 and 11 of the bipolar transistors T2 and T1 are connected to the terminal S via the resistors 9 and 10. The type of the two bipolar transistors is chosen such that they have a conductivity opposite to the direction of the PMOS transistor. The emitter-base diode has the same junction as the collector-bulk diode of the field-effect transistor. Two pnp bipolar transistors are thus used with a PMOS transistor. Npn bipolar transistors would be employed when using an NMOS transistor. Additionally, as illustrated in FIG. 1b, at least one of the transistors T1 and T2 may comprise unipolar transistors of the same conductivity type as the transistor 99. In such an arrangement, the gates 11a, 21a of transistors T1 and T2 are connected to the source 2, the sources 13a, 23 are connected to the drain 1, and the drain 12a of T1 is connected to the control input 3, while the drain 22a of T2 is connected to the bulk terminal 4.

The potential VS is present at the input S, and the potential VD is tapped off at the output D and fed to further circuits (not shown). In the normal operating mode, the potential VD at the input D is always less than the potential VS at the input S, so that the pn junctions between the regions P1 and N2/N1 and P2 and N2/N1 are biased oppositely to the forward direction. This prevents an undesirable current flow from the substrate into the drain region. At the same time, the potential at the emitter inputs of the pnp transistors T1 and T2 is less than the potential at the collector terminal and at the base. As a result, these transistors turn off. The PMOS transistor operates normally.

If the potential VD at the output D rises above the potential VS at the input S on account of an erroneous operation or an electrostatic discharge then without the formation of the circuit arrangement according to the invention, a parasitic vertical transistor VT and also a parasitic lateral transistor LT are turned on. The region N2 pulled to the potential VS via the bulk terminal 4 acts, with respect to the drain region P2 that is at a higher potential, as a forward-biased pn junction or as a base of a parasitic transistor. As a result, a vertical current flows via the drain region P2 and the base N2/N1 into the p-type substrate acting as a collector and a lateral current also flows via the drain region P2 and the base N2 into the source region P1 of the PMOS transistor. The latter is primarily triggered by the current flowing through the region N1.

With the circuit arrangement according to the invention, when potential VD is higher than the potential VS, the base-emitter junction of the pnp bipolar transistor T1 is forward-biased and the transistor T1 switches the potential VD to the control terminal 3 of the PMOS transistor. As a result, the control terminal is pulled to a positive potential and a current flow in the opposite direction through the PMOS transistor is switched off. At the same time, the pnp bipolar transistor T2 switches and, with the collector terminal 22, pulls the bulk terminal 4 of the PMOS field-effect transistor to the potential VD. Consequently, the partial region N2—representing a virtual base—of the vertical or lateral parasitic bipolar transistor is pulled to a high potential and thereby prevents the formation of parasitic bipolar transistors. A residual current that is possibly present flows via the transistor T2 and the resistor 5, which is chosen to have a mean value. The two pnp bipolar transistors T1 and T2 only ever switch when the potential VD becomes greater than the potential VS by a diode forward voltage, so that the base-emitter junction undergoes transition from an off state into a conducting state. The resistor 5 and the voltage drop triggered by the base current of the parasitic transistors enable the switch-off process in this case.

Figure 2:
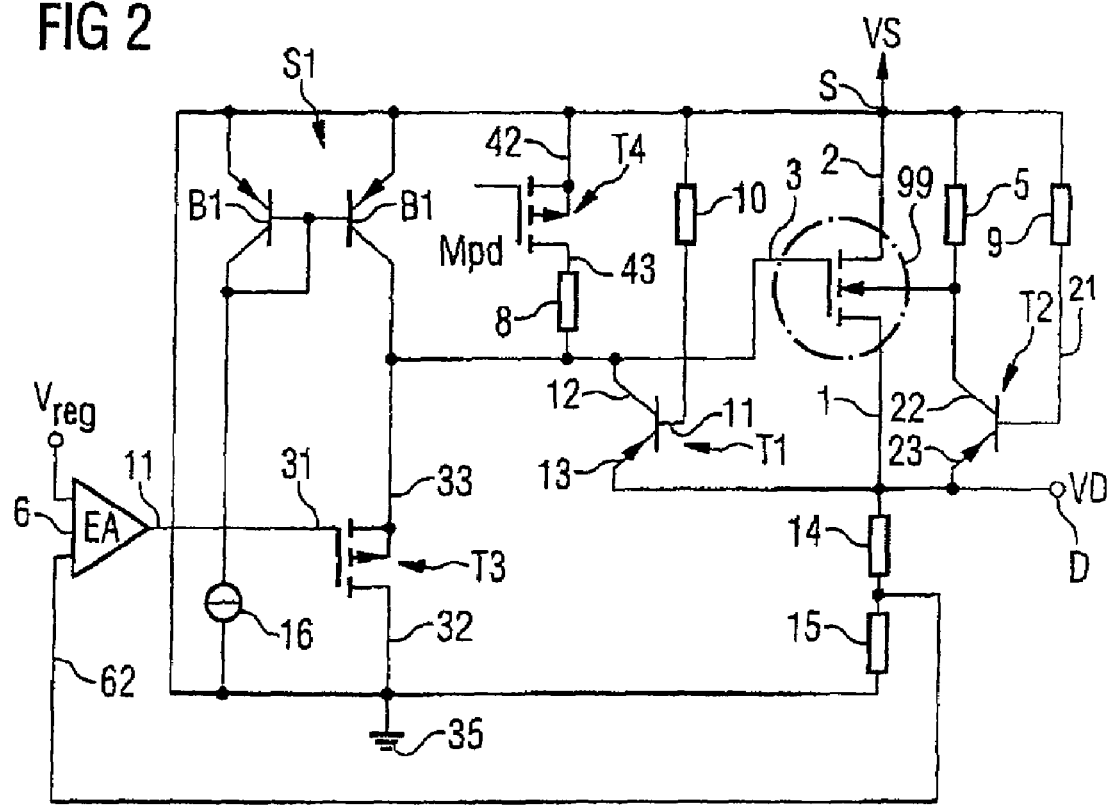
FIG. 2 shows an embodiment of a voltage regulating device.
Figure 3:
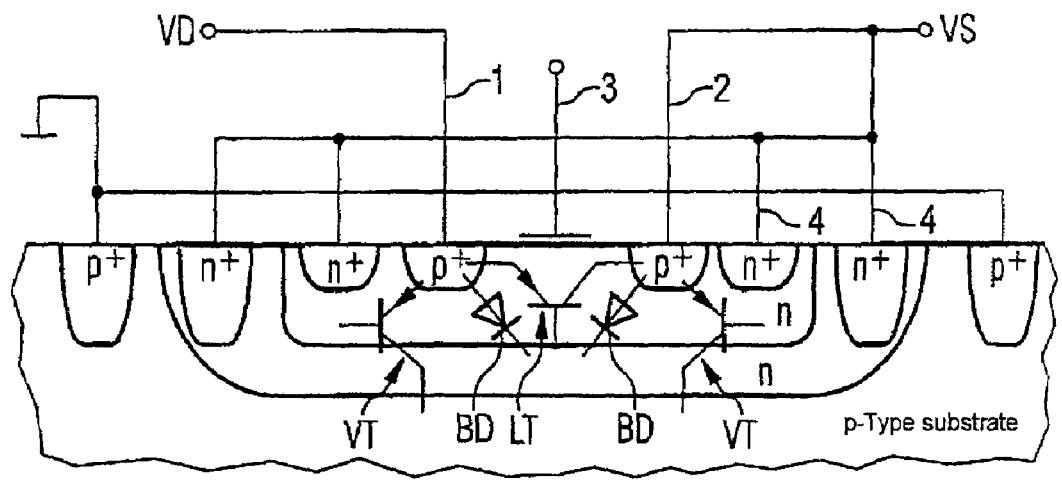
FIG. 3 shows a sketch of a prior art PMOS transistor with parasitic elements.
Figure 4A:
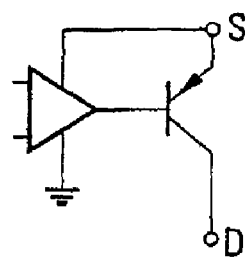
FIGS. 4A-4C show prior art configurations for preventing a current flow in the opposite direction.
Figure 4B:
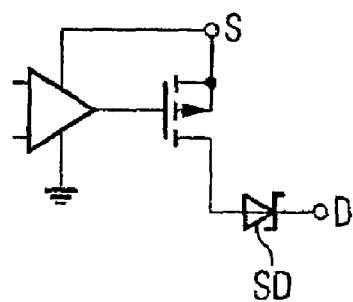
Figure 4C:
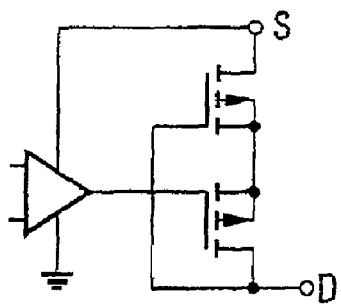

This circuit arrangement can be used to construct a voltage regulating device which, for its part, uses CMOS circuit technology for the voltage regulation. CMOS circuit technology has the major advantage that it can also be used to realize small voltage differences between input and output. Such a voltage regulating device, which is primarily used for a voltage supply in universal serial bus apparatuses, is shown in FIG. 2. Identical components in this case bear identical reference symbols.

In the exemplary embodiment of the voltage regulating device, the drain output 1 of the PMOS field-effect transistor 99 forms the output D of the voltage regulating device and is connected to an input 62 of a differential amplifier 6 via a resistor 14. A second input of the differential amplifier 6 carries a reference potential $V_{ref}$. For the voltage supply, the differential amplifier 6 is connected to the node S, which carries the supply potential VS, and also to the ground potential 35 and, via the resistor 15, to the resistor 14.

The voltage regulating device has a current mirror S1 formed from two pnp bipolar transistors B1 and B2. The emitter terminals of the two bipolar transistors B1 and B2 are connected to the node S and the supply potential VS. The bases of the two bipolar transistors B1 and B2 are connected to one another and also to the collector terminal of the bipolar transistor B1. Furthermore, the collector terminal of the bipolar transistor B1 is connected to a current source 16.

The collector output of the second pnp bipolar transistor B2 of the current mirror S1 is connected both to the control terminal 3 of the PMOS transistor 99 and to a source terminal 33 of a second PMOS transistor T3. The drain output 32 of the field-effect transistor T3 is connected to ground. The gate terminal 31 of the transistor T3 is connected to the output of the differential amplifier 6 and T3 also has its output 32 that operates as a source follower.

Furthermore, a further PMOS transistor T4 and, in series therewith, a resistor 8 are connected between the terminal S and the gate terminal 3 of the PMOS transistor 99. It serves for fixing the gate of the field-effect transistor 99 in the switched-off state.

In a normal operating mode, the differential amplifier 6 compares the potential VD at the output D of the voltage regulating device with a reference potential $V_{reg}$ and generates a control signal therefrom and outputs said control signal at the input 31. The control signal controls the conductivity of the transistor T3 and thus the voltage drop across T3. This also regulates the voltage drop across the PMOS field-effect transistor 99 and the potential VD at the output D. Relative to a ground potential, an adjustable voltage that can be used for supplying further circuit blocks is therefore established at the output D. If the field-effect transistor T4 is brought to a conductive state via its control terminal, the potential VS is present at the control terminal 3 of the PMOS transistor 99 and the gate of the transistor 99 turns off. The supply currents and the voltage regulating device are switched off.

If the potential VD at the output D rises above the potential VS at the node S then the pnp bipolar transistors T1 and T2 operate in the manner described in FIG. 1a and prevent a current flow from the output D to the node S.

The resistor 8 between the control terminal 3 of the PMOS field-effect transistor 99 and drain terminal 43 of the PMOS transistor T4 is necessary in order, in the case of protection, to keep down a current flow via the substrate diode of the PMOS transistor T4. Therefore, the resistor 8 is in the region of a few hundred kiloohms in the exemplary embodiment. The base-emitter diode of the pnp bipolar transistor B2 of the current mirror S1 likewise prevents a current flow from the output D via the transistor T1 to the node S.

The provision of the circuit arrangement according to the invention having the two transistors T1 and T2 thus makes it possible to implement a voltage regulating device which, by means of CMOS circuit technology, implements even small voltage differences between input and output and at the same time has an effective protection in the event of incorrect polarity or opposite currents. The concept presented in this case likewise permits protection of circuits in NMOS technology against potentials at the output below the ground potential. For this purpose, it is merely necessary to replace the semiconductor components by semiconductor components of opposite conductivity types. In particular, the PMOS transistor can be replaced by an NMOS transistor with simultaneous interchanging of all the potentials and the use of npn bipolar transistors. Additionally, one or more of the transistors T1 and T2 can comprise unipolar or MOS transistors with their respective pates, sources and drains connected up in a manner corresponding to the respective bases, emitters and collectors should bipolar transistors be used for T1 and T2. The voltage regulating device described in the exemplary embodiment is used in apparatuses with a universal serial bus terminal. However, it can be used in any circuit in which different voltages have to be derived from a supply voltage, for example a battery. Moreover, variations of the voltage regulating device may be realized, the output transistor being protected against electrostatic discharge Although the invention has been shown and described with respect to a certain aspect or various aspects, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several aspects of the invention, such feature may be combined with one or more other features of the other aspects as may be desired and advantageous for any given or particular application. Furthermore, to the extent that the term "includes" is used in either the detailed description or the claims, such term is intended to be inclusive in a manner similar to the term "comprising."

| List of Reference Symbols | |
|---|---|
| 99: | PMOS transistor |
| 1: | Drain terminal |
| 2: | Source terminal |
| 3: | Control terminal |
| 4: | Bulk terminal |
| 5, 8, 9, 10, 14, 15: | Resistors |
| 6: | Differential amplifier |
| 11, 21: | Base |
| 13, 23: | Emitter terminal |
| 12, 22: | Collector output |
| 31: | Control terminal |
| 32, 43: | Drain terminal |
| 33, 42: | Source terminal |
| 62: | Input of the differential amplifier |
| T1, T2: | pnp Bipolar transistors |
| T3, T4: | PMOS transistors |
| S1: | Current mirror |
| B1, B2: | pnp Bipolar transistors |
| S: | Node |
| D: | Output |
| VS: | Supply potential |
| VD: | Drain potential |
| P1: | Source region |
| P2: | Drain region |
| N1, N2: | n-Doped region |
| VT: | Vertical parasitic transistor |
| LT: | Lateral parasitic transistor |
| BD: | Substrate diode |
| SD: | Schottky diode |
| ST: | PMOS transistor |

The invention claimed is:

1. A circuit arrangement for protection against electrostatic discharge or other anomalous voltage conditions, comprising:
   a unipolar transistor of a first conductivity type having a source terminal, a drain terminal, a control terminal for controlling the unipolar transistor, and a bulk terminal; and
   first and second controllable paths each comprising a control terminal for controlling the first and second controllable paths, respectively, the control terminal of the first and second controllable paths being coupled to the source terminal but not the drain terminal of the unipolar transistor,
   wherein a first terminal of the first controllable path is coupled to the control terminal of the unipolar transistor, a first terminal of the second controllable path is coupled to the bulk terminal of the unipolar transistor, and a second terminal of each of the first and second controllable paths is coupled to the drain terminal of the unipolar transistor.

2. The circuit arrangement as claimed in claim 1, wherein at least one of the controllable paths comprises a second unipolar transistor of the first conductivity type, the source terminal of which forms the second terminal, the drain terminal of which forms the first terminal, and the gate terminal of which forms the control terminal of the at least one of the controllable paths.

3. The circuit arrangement as claimed in claim 2, wherein the unipolar transistor and the at least one controllable path comprise a metal insulator semiconductor or a metal oxide semiconductor transistor.

4. The circuit arrangement as claimed in claim 1, wherein at least one of the controllable paths comprises a bipolar transistor, an emitter terminal of which forms the second terminal, a collector terminal of which forms the first terminal, and a base of which forms the control terminal of the at least one of the controllable paths, and the base of which is of a second conductivity type.

5. The circuit arrangement as claimed in claim 1, wherein the bulk terminal of the unipolar transistor is coupled to the source terminal of the unipolar transistor via a resistor.

6. The circuit arrangement as claimed in claim 1, wherein the unipolar transistor and the first and second controllable paths are integrated in a common semiconductor substrate.

7. The circuit arrangement as claimed in claim 6, wherein at least one of the controllable paths comprises a bipolar transistor, and wherein the bipolar transistor comprises a parasitic bipolar transistor in a metal oxide semiconductor circuit technology or comprises a bipolar transistor in a BiCMOS circuit technology.

8. The circuit arrangement as claimed in claim 1, the control terminal of the first and second controllable paths being coupled through respective resistors to the source terminal of the unipolar transistor.

9. The circuit arrangement as claimed in claim 1, the first terminal of the first controllable path coupled directly to the control terminal of the unipolar transistor.

10. The circuit arrangement as claimed in claim 1, the second terminal of each of the first and second controllable paths coupled to the drain terminal of the unipolar transistor, but not the respective control terminals of the first and second controllable paths.

11. A voltage regulating device, comprising:
a protection device, comprising:
- a unipolar transistor of a first conductivity type having a source terminal, a drain terminal, a control terminal for controlling the unipolar transistor, and a bulk terminal; and
- first and second controllable paths each comprising a control terminal for controlling the first and second controllable paths, respectively, the control terminal of the first and second controllable paths being coupled to the source terminal but not the drain terminal of the unipolar transistor,
- wherein a first terminal of the first controllable path is coupled to the control terminal of the unipolar transistor, a first terminal of the second controllable path is coupled to the bulk terminal of the unipolar transistor, and a second terminal of each of the first and second controllable paths is coupled to the drain terminal of the unipolar transistor; and
- a comparator circuit configured to generate a control signal based on a difference between two signals applied to an input thereof, and having a control output coupled to the control terminal of the unipolar transistor, and wherein one of the inputs of the comparator circuit is coupled to the drain terminal of the unipolar transistor,
wherein the drain terminal of the unipolar transistor is coupled to an output of the voltage regulating device for outputting a regulated potential as a function of the control output of the comparator circuit.

12. The voltage regulating device as claimed in claim 10, wherein the current source comprises two bipolar transistors forming a current mirror, wherein a collector terminal of one of the two bipolar transistors is connected to the second terminal of the third controllable path.

13. The voltage regulating device as claimed in claim 12, further comprising a fourth controllable path, wherein the source terminal of the unipolar transistor is connected to a first terminal of the fourth controllable path, and a second terminal of the fourth controllable path is coupled to the control terminal of the unipolar transistor via a resistor.

14. The voltage regulating device as claimed in claim 13, wherein the voltage regulating device is switched off by a signal to a control terminal of the fourth controllable path.

15. A voltage regulating device, comprising:
a protection device, comprising:
- a unipolar transistor of a first conductivity type having a source terminal, a drain terminal, a control terminal for controlling the unipolar transistor, and a bulk terminal; and
- first and second controllable oaths each comprising a control terminal for controlling the first and second controllable oaths, respectively, the control terminal of the first and second controllable oaths being coupled to the source terminal of the unipolar transistor,
- wherein a first terminal of the first controllable oath is coupled to the control terminal of the unipolar transistor, a first terminal of the second controllable oath is coupled to the bulk terminal of the unipolar transistor, and a second terminal of each of the first and second controllable oaths is coupled to the drain terminal of the unipolar transistor;
- a comparator circuit configured to generate a control signal based on a difference between two signals applied to an input thereof, and having a control output coupled to the control terminal of the unipolar transistor, and wherein one of the inputs of the comparator circuit is coupled to the drain terminal of the unipolar transistor,
wherein the drain terminal of the unipolar transistor is coupled to an output of the voltage regulating device for outputting a regulated potential as a function of the control output of the comparator circuit; and
a third controllable path, wherein the control output of the comparator circuit is connected to a control input of the third controllable path, a first terminal of the third controllable path is coupled to a predetermined potential, and a second terminal of the third controllable path is coupled to a current source and to the control terminal of the unipolar transistor.

* * * * *